(12) United States Patent
Pidutti et al.

(10) Patent No.: US 7,023,289 B2
(45) Date of Patent: Apr. 4, 2006

(54) PROGRAMMABLE OSCILLATOR

(75) Inventors: Albino Pidutti, Udine (IT); Stefano Beria, Pavia (IT)

(73) Assignee: STMicroelectronics S.r.l., Agrate Brianza (IT)

(*) Notice: Subject to any disclaimer, the term of this patent is extended or adjusted under 35 U.S.C. 154(b) by 73 days.

(21) Appl. No.: 10/715,338

(22) Filed: Nov. 17, 2003

(65) Prior Publication Data

US 2005/0052254 A1   Mar. 10, 2005

(30) Foreign Application Priority Data

Nov. 15, 2002   (IT)   ............... MI2002A2428

(51) Int. Cl.
*H03B 5/24* (2006.01)
*H05B 41/28* (2006.01)
*H05B 41/282* (2006.01)

(52) U.S. Cl. .................. 331/111; 331/108 C; 331/143; 331/150; 331/177 R; 315/209 R; 315/226

(58) Field of Classification Search ............ 331/108 C, 331/111, 143, 150, 177 R; 315/209 R, 226, 315/227 R, 240, 245

See application file for complete search history.

(56) References Cited

U.S. PATENT DOCUMENTS

| 4,723,114 A | * | 2/1988 | D'Arrigo et al. ........... 331/111 |
| 4,931,750 A | * | 6/1990 | Gontowski ................. 331/111 |
| 6,603,366 B1 | * | 8/2003 | Huang et al. ............... 331/111 |

* cited by examiner

*Primary Examiner*—David Mis
(74) *Attorney, Agent, or Firm*—Lisa K. Jorgenson; Bryan A. Santarelli; Graybeal Jackson Haley LLP

(57) ABSTRACT

A programmable oscillator comprises a capacitor; a current generator couplable to said capacitor that generates a charging current of said capacitor; further comprising at least one resistance coupled to said capacitor; a comparator coupled to said capacitor for comparing a voltage at the terminals of said capacitor with a prefixed reference voltage and for generating an output signal; a first switch, controlled by said output signal, coupled to said capacitor that creates a current path able to facilitate the discharging of said capacitor.

20 Claims, 5 Drawing Sheets

US 7,023,289 B2

PROGRAMMABLE OSCILLATOR

PRIORITY CLAIM

This application claims priority from Italian patent application No. MI2002A 002428, filed Nov. 15, 2002, which is incorporated herein by reference.

TECHNICAL FIELD

The present invention refers generally to a programmable oscillator and particularly to a programmable oscillator of the RC (Resistance, Capacitor) type. The present invention refers also to a controller circuit for lamps of the ballast type, and to an integrated circuit comprising a programmable oscillator of the RC type.

BACKGROUND

An oscillator in some cases has to satisfy different requirements as for instance the following:

- allowing the oscillation frequency to vary with continuity in a prefixed range of frequencies;
- making available externally a terminal on which to act for varying its frequency;
- guaranteeing an excellent precision of the planned frequency.

Besides, the possibility to integrate and to manage a great number of functions using a silicon area as small as possible has become a more and more important characteristic in a wide range of integrated circuits that comprise among the others the control devices for lamps of the ballast type, for power supplies, particularly those switching, for motors and many others.

These integrated circuits often have an extremely reduced number of terminals relative to the number of functions that they perform.

In view of the state of the art described, an embodiment of the present invention provides a programmable oscillator of the RC (Resistance, Capacitor) type that satisfies the above-listed requirements.

According to this embodiment of the present invention, a programmable oscillator comprises a capacitor; a current generator couplable to said capacitor that generates a charging current of said capacitor; at least one resistance coupled to said capacitor; a comparator coupled to said capacitor for comparing a voltage at the terminals of said capacitor with a prefixed reference voltage and for generating an output signal; and a first switch, controlled by said output signal, coupled to said capacitor, that creates a current path to facilitate the discharging of said capacitor.

Such a programmable oscillator can be included in a controller circuit for lamps of the ballast type comprising a half bridge that drives a lamp, wherein said half bridge is controlled by the oscillator.

Furthermore, an integrated circuit may comprise such a programmable oscillator, where the integrated circuit comprises only a first and a second control pin arranged outside said integrated circuit; said current generator is coupled to said first pin; and said capacitor is coupled to said second pin.

Consequently it is possible to implement a programmable oscillator of the RC type that has only two outside terminals and that also maintains high level precision and programmability.

BRIEF DESCRIPTION OF THE DRAWINGS

The features and the advantages of the present invention will be made more evident by the following detailed description of a particular embodiment, illustrated as a non-limiting example in the annexed drawings, wherein.

DETAILED DESCRIPTION

Figure 1:
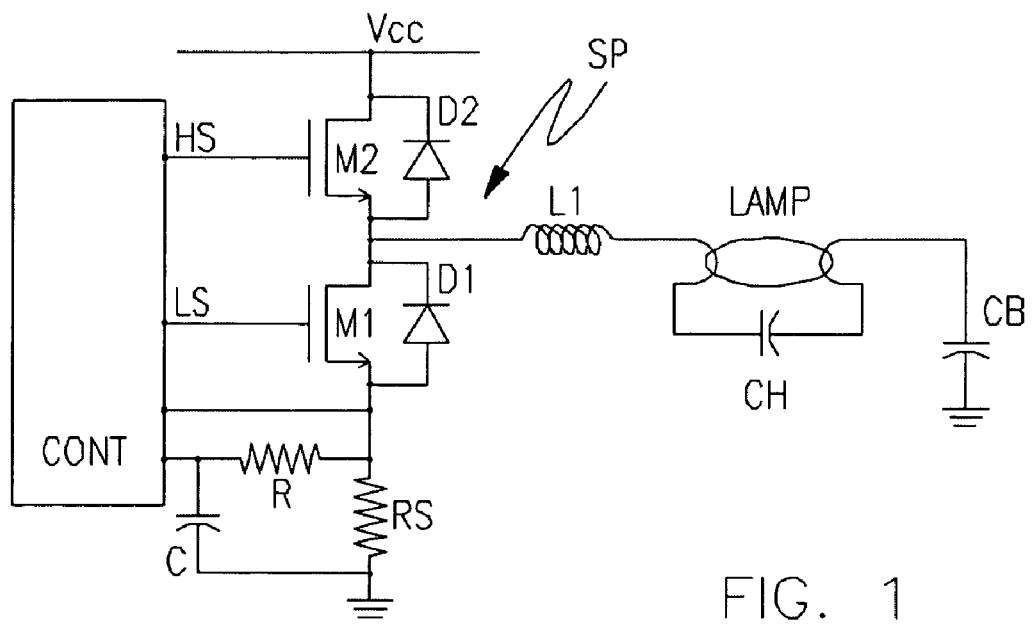
FIG. 1 shows an exemplifying scheme of a controller circuit for lamps of the ballast type according to an embodiment of the invention.

Referring now to FIG. 1, that shows an exemplifying scheme of a controller circuit for lamp of the ballast type according to an embodiment of the invention. A half bridge SP is constituted by transistors M1 and M2 and by respective diodes D1 and D2 is supplied by a substantially direct voltage Vcc provided by a pre-regulator stage PFC (Power Factor Corrector) placed upstream and not shown.

By means of a resistance RS connected in series to the half bridge SP, information is sent to a controller CONT, both with respect to the peak current of the half bridge SP, and with respect to the power of the lamp LAMP, by means of a filter RC composed by the resistance R and by the capacitor C, that filter the signal coming from the resistance RS.

The central point of the half bridge SP is connected to an inductance L1, therefore to the lamp LAMP and to the capacitor CB; a capacitor CH is connected in series with the filaments of the lamp LAMP.

The capacitor CB, also called half-battery capacitor, charges itself at a voltage that is half that of the half bridge SP, and it has a sufficiently high value as to neglect the ripple voltage at its terminals.

The capacitor CH has instead a fundamental role for the lighting of the lamp LAMP as, by resonating with the inductance L1, it allows the arc firing of the lamp LAMP. However, when the lamp is turned, CH is short-circuited by the low impedance of the lamp LAMP.

The transistors M1 and M2 are controlled by the controller CONT with the signals LS and HS respectively having a 50% operating cycle.

The signals LS and HS are generated inside the controller CONT by the use of an RC oscillator operating by charge/discharge of a capacitor.

Figure 2:
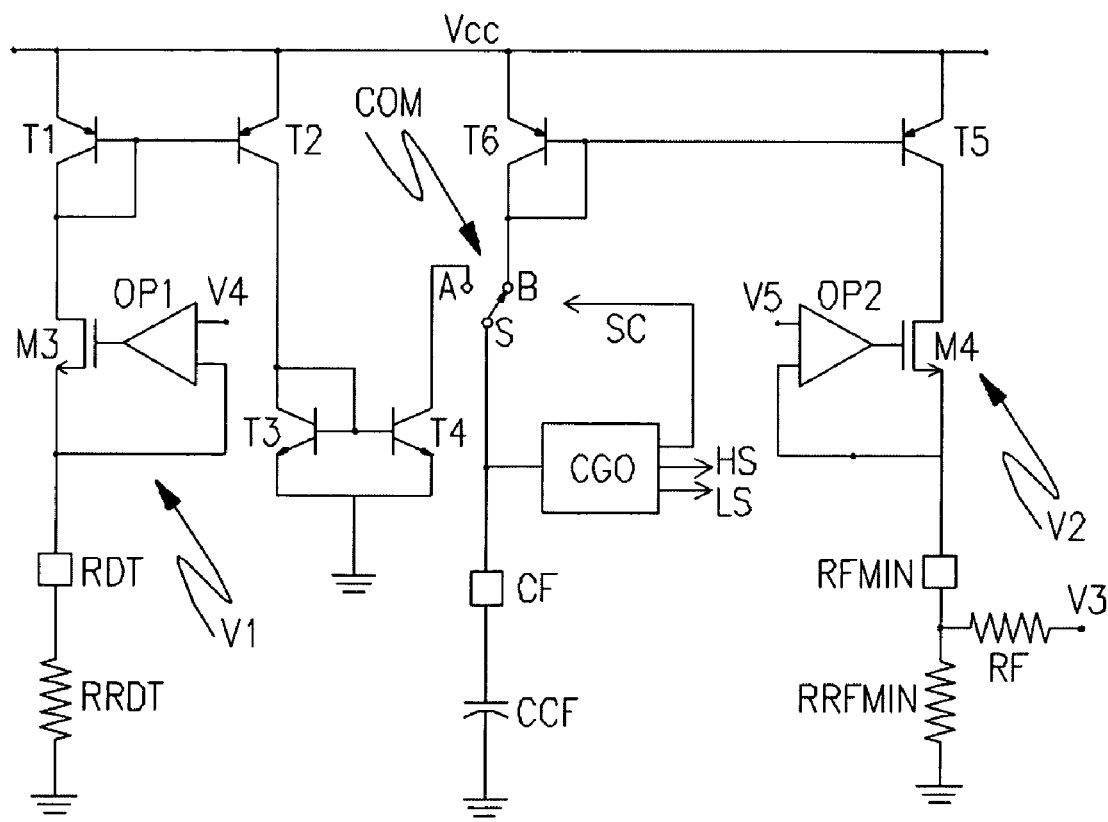
FIG. 2 shows an exemplifying scheme of a programmable oscillator of the RC type, according to the prior art, used in a controller circuit for lamps of the ballast type.

We refer now to FIG. 2 that shows an exemplifying scheme of a programmable oscillator of the RC type according to the prior art.

It deals with a classical RC oscillator that can belong to an integrated circuit having three external terminals. A first terminal CF to which a terminal of the capacitor CCF is applied, the other terminal of the capacitor CCF is connected to ground. A second terminal RDT to which a terminal of a resistance RRDT is connected, the other terminal of the resistance RRDT is connected to ground. A third terminal RFMIN to which a terminal of a resistance RRFMIN and a terminal of a resistance RF are connected, the other terminal of the resistance RRFMIN is connected to ground, the other terminal of the resistance RF is connected to the voltage V3.

To the resistance RRDT is connected a voltage generator V1. It is composed by an operational amplifier OP1 to whose output the gate of a transistor M3 is connected, whose source is connected to the resistance RRDT and to an input of the operational amplifier OP1, to the other input of the operational amplifier OP1 a prefixed voltage V4 is applied. The drain of the transistor M3 is connected to a current mirror connected to the voltage Vcc, formed by the transistor T1 connected as a diode and by the transistor T2 which is connected in turn to another current mirror connected to ground, formed by the transistor T3 connected as a diode and by the transistor T4, whose collector is connected to a terminal A of a switch COM.

To the resistance RRFMIN a voltage generator V2 is connected. It is composed by an operational amplifier OP2 to whose output the gate of a transistor M4 is connected, whose source is connected to the resistance RRFMIN and to an input of the operational amplifier OP2, to the other input of the operational amplifier OP2 a prefixed voltage V5 is applied. The drain of the transistor M4 is connected to a current mirror connected to the voltage Vcc, formed by the transistor T5 connected as a diode and by the transistor T6, whose collector is connected to a terminal B of a switch COM.

The common terminal S of the switch COM is connected to the capacitor CCF.

The signal available on the terminal CF is input to a management circuit CGO of the oscillator that outputs a control signal SC for the switch COM and the driving signals HS and LS for the half bridge SP.

Two programmable currents are independently used to separately define both the charge and the discharge time. A first current generator is formed by the voltage generator V1 and by the resistance RRDT. A second current generator is formed by the voltage generator V2 and by the resistance RRFMIN.

The discharging current of the capacitor CCF is defined by the resistance RRDT to which the fixed voltage V4 is applied. The charging current of the capacitor CCF is defined by the resistance RRFMIN to which the fixed voltage V5 is applied. The voltage V3 is used for varying the charging current of the capacitor CCF.

Relative to the lamp-controller circuit of the ballast type, the discharging time defines the duration of the dead time, while the period of the oscillator is defined by the sum of the charging and discharging time.

Figure 3:
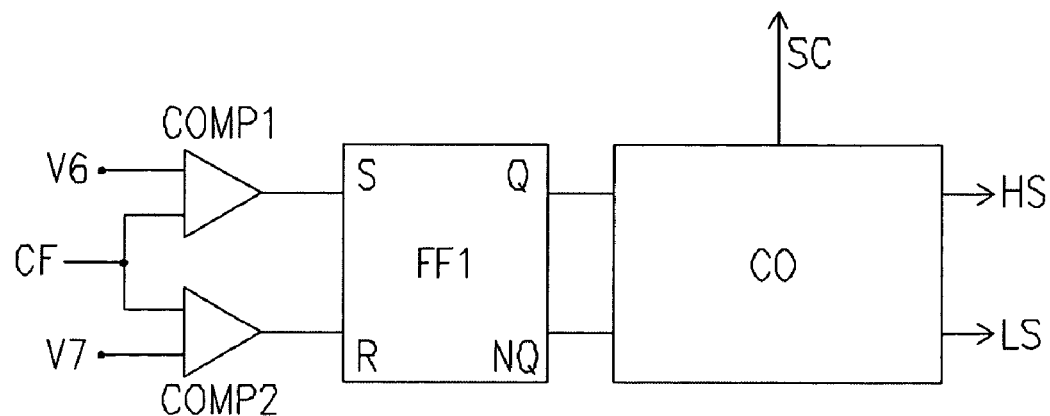
FIG. 3 shows an exemplifying scheme of a management circuit of the programmable oscillator of the RC type according to the prior art of FIG. 2.

In FIG. 3, which is a block diagram of the management circuit CGO of the oscillator of FIG. 2, the voltage on the capacitor CCF, available on the terminal CF, is monitored by the window comparators COMP1 and COMP2 to which the reference voltages V6 and V7 are respectively applied. The outputs of the window comparators COMP1 and COMP2 are respectively applied to the set S and reset R inputs of a flip flop FF1. The outputs Q and NQ are applied to a control circuit CO that provides the control signal SC of the switch COM and therefore it controls the charging and the discharging of the capacitor CCF. Control circuit CO also provides the driving signals HS and LS of the half bridge SP.

Control circuit CO carries out also the following functions. It divides by two the frequency generated by the oscillator to control the half bridge SP with an operating cycle of 50%. It inserts at the half and at the end of the period the necessary dead times to avoid the cross conduction of the transistors M1 and M2 of FIG. 1 (the dead times are timed by the discharge of the capacitor CCF). It eliminates the first cycle of the oscillator so that the half bridge SP starts the switching only from the second cycle of the capacitor CCF, since in the normal operation the oscillation occurs between two thresholds both different from zero, and the first cycle is longer since the capacitor CCF is initially discharged. It assures that at the lighting the transistor M2 is always turned on as first in order to be able to charge the capacitor CCF.

Figure 4:
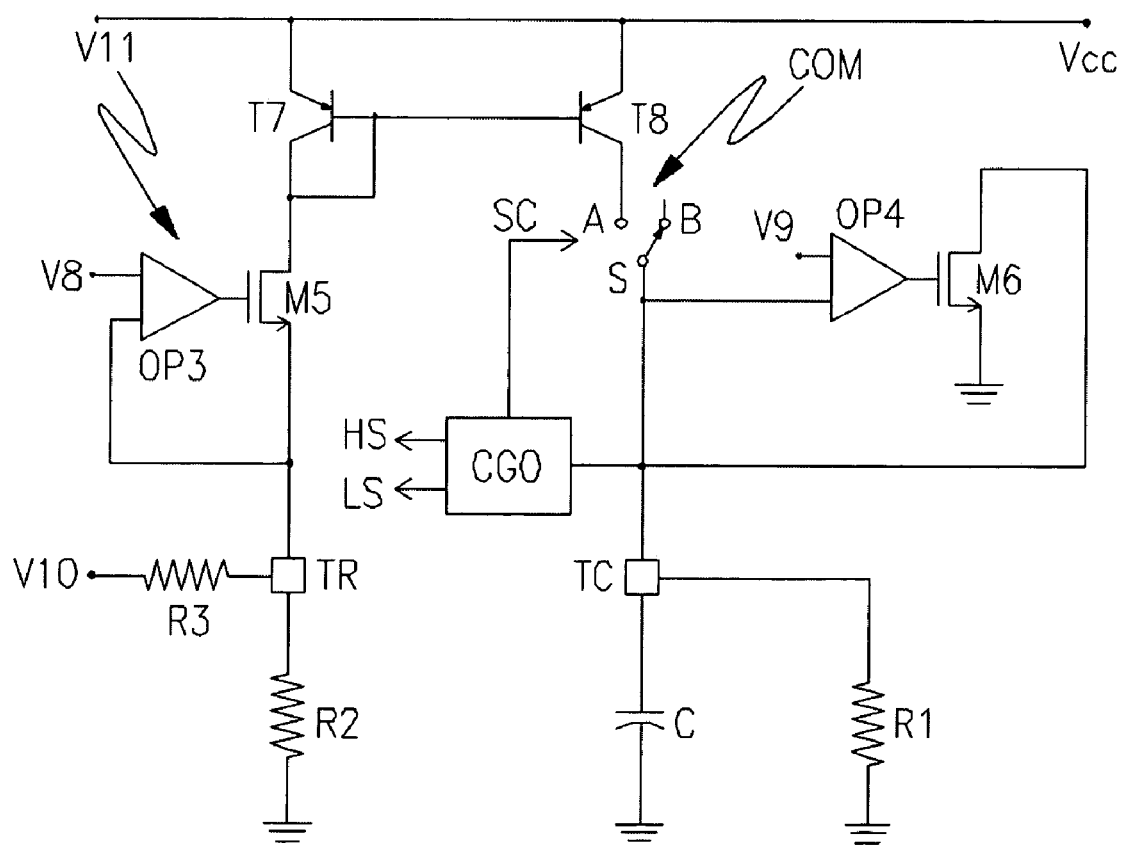
FIG. 4 shows an exemplifying scheme of a programmable oscillator of the RC type according to an embodiment of the present invention.

We refer now to FIG. 4 that shows an exemplifying scheme of a programmable oscillator of the RC type according to an embodiment of the present invention.

It deals with an RC oscillator that can belong to an integrated circuit having only two external terminals. A first terminal TC to which a terminal of the capacitor C is applied, the other terminal of the capacitor C is connected to ground, in parallel to the capacitor C a resistance R1 is connected. A second terminal TR to which a terminal of a resistance R2 and a terminal of a resistance R3 are connected, the other terminal of the resistance R2 is connected to ground, the other terminal of the resistance R3 is connected to the voltage V10.

To the terminal TR a voltage generator V11 is connected. It is formed by an operational amplifier OP3 to whose output the gate of a transistor M5 is connected, whose source is connected to the terminal TR and to an input of the operational amplifier OP3, to the other input of the operational amplifier OP3 is applied to a prefixed voltage V8. The drain of the transistor M5 is connected to a current mirror connected to the voltage Vcc, formed by the transistor T7 connected as a diode and by the transistor T8 which is connected in turn to a terminal A of a switch COM.

The terminal B of the switch COM is not connected. The common terminal S of the switch COM is connected to the terminal TC. To the terminal TC an input of an operational amplifier OP4 is connected, to the other input of the operational amplifier OP4 the reference voltage V9 is applied. The output of the operational amplifier OP4 is connected to the gate of a transistor M6, whose source is connected to ground and its drain is connected to the terminal TC.

The switch COM is controlled by the signal SC in a traditional way.

The signal available on the terminal TC is input to a management circuit CGO of the oscillator that outputs the control signal SC to the switch COM and outputs the driving signals HS and LS of the half bridge SP (FIG. 1).

The charging current of the capacitor C is determined by a current generator composed by the voltage generator V11 and by the resistance R2. The resistance R3 and the reference voltage V10 allow variation of this current according to the requirements of the application.

By switching the switch COM from the position A to the position B the discharge of the capacitor C is obtained by means of the resistance R1 connected in parallel.

When the voltage on the capacitor C reaches the reference voltage V9, the operational amplifier OP4 activates the transistor M6, which discharges the capacitor C by coupling it to ground via a low-resistance path.

Figure 5:
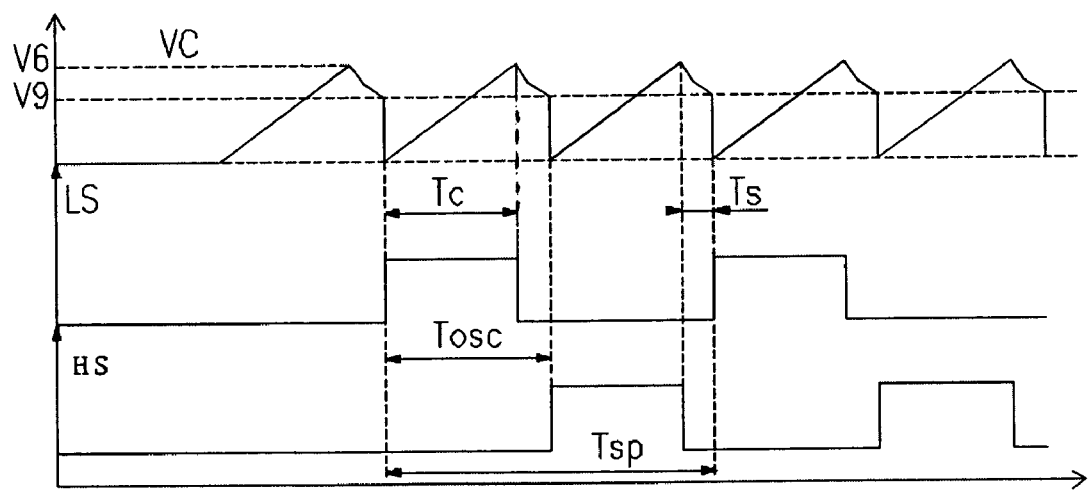
FIG. 5 shows the voltages available at some points of the circuit of FIG. 4 according to an embodiment of the invention.

In FIG. 5 are shown the voltages available in some points of the circuit of FIG. 4 according to an embodiment of the invention.

The voltage VC across the terminals of the capacitor C increases up to the reference voltage V6 (during the time Tc), then the switch COM switches from the position A to the position B, and the capacitor starts discharging down to the reference voltage V9 via the resistor R1 (during the time Ts). When the voltage VC across the capacitor C reaches V9, it discharges completely by means of the transistor M6.

The driving signals LS and HS of the transistors M2 and M1 are also shown.

Tosc denotes the oscillation period, and Tsp denotes the period of the half bridge SP.

Figure 6:
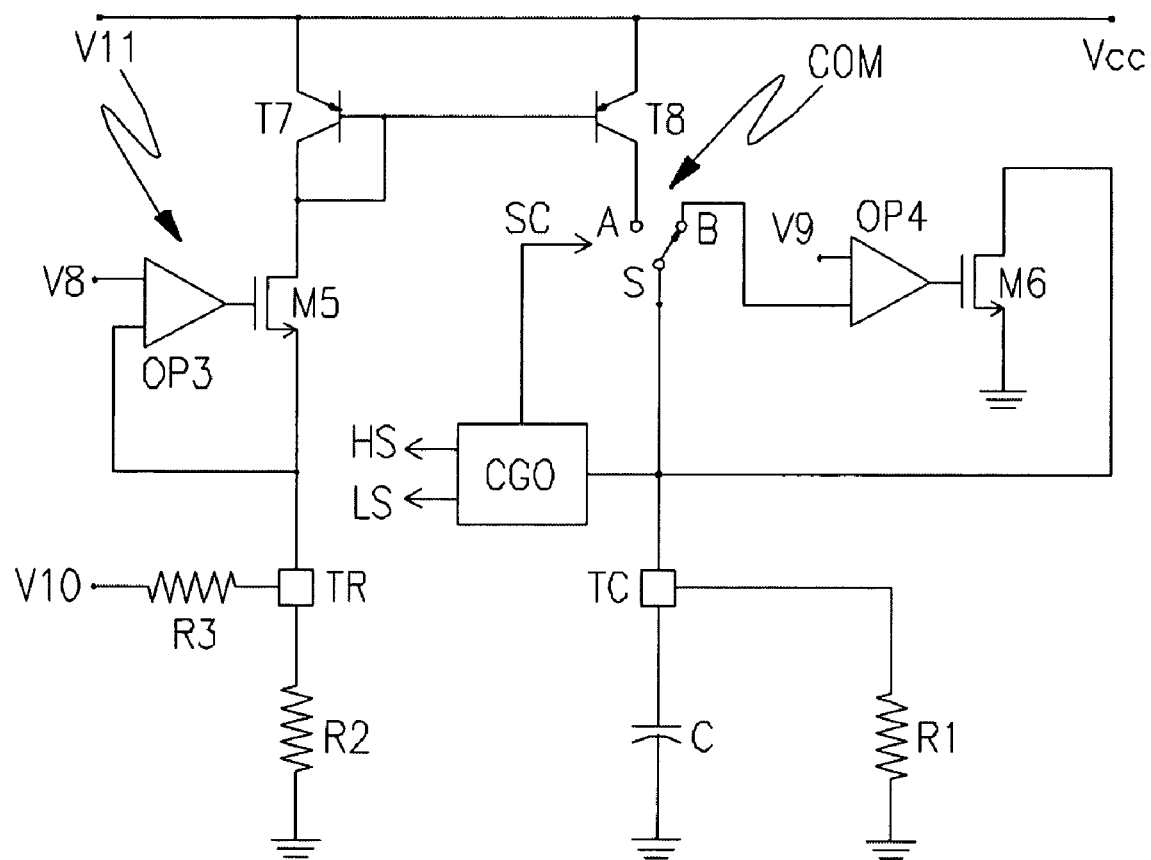
FIG. 6 shows a scheme of a programmable oscillator of the RC type according to another embodiment of the present invention.

The programmable oscillator of FIG. 6 is similar to the programmable oscillator of FIG. 4; one difference is that in the oscillator of FIG. 6, one input of OP4 is coupled to the node B of the switch COM instead of to the terminal TC.

Figure 7:
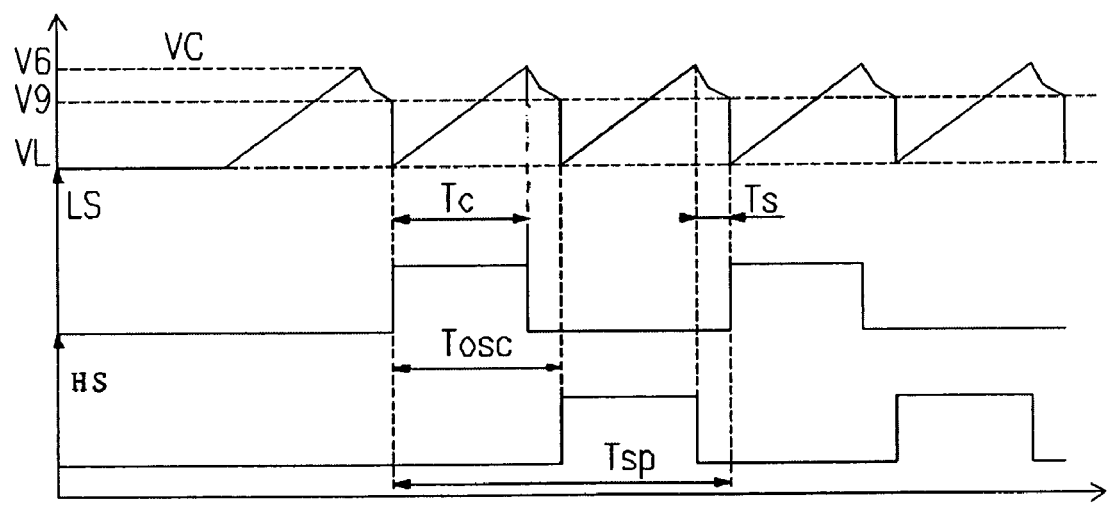
FIG. 7 shows the voltages available at some points of the circuit of FIG. 6 according to an embodiment of the invention.

The operation of the programmable oscillator of FIG. 6 is discussed in conjunction with FIGS. 3, 6, and 7.

Referring to FIG. 7, during a first portion Tc of the oscillation period Tosc, the switch COM is in the A position such that the voltage generator V11 charges the capacitor C from a voltage VL to the voltage V6. Then, the signal SC switches COM to the B position.

During a second portion Ts of the oscillation period Tosc, the switch COM is in the B position. First, the capacitor C discharges through the resistor R1 from the voltage V6 to the voltage V9 (this discharge is represented by the exponentially decaying portions of the waveform in FIG. 7). When the voltage across the capacitor C is lower than V9, OP4 turns on the transistor M6, which discharges the capacitor C to the voltage VL—in one embodiment, the voltage VL=0 volts, and in another embodiment, the voltage VL=V7, although VL may have other values. Typically, the on resistance of the transistor M6 is much less than R1, such that the capacitor C discharges more quickly through M6 than through R1. Then, the signal SC switches COM back to the A position, and the oscillator period Tosc repeats.

From the foregoing it will be appreciated that, although specific embodiments of the invention have been described herein for purposes of illustration, various modifications may be made without deviating from the spirit and scope of the invention.

What is claimed is:

1. A programmable oscillator comprising:
   a capacitor;
   a current generator couplable to said capacitor and that generates a charging current for said capacitor;
   at least one resistor coupled to said capacitor and operable to discharge the capacitor during a first time period;
   a comparator coupled to said capacitor for comparing a voltage at a terminal of said capacitor with a prefixed reference voltage and for generating an output signal; and
   a first switch, controlled by said output signal, coupled to said capacitor, and operable to discharge said capacitor during a second time period that is different than said first time period.

2. The oscillator according to claim 1 wherein said oscillator generates an output voltage comprised between a first voltage value and a second voltage value and said prefixed reference voltage is comprised between said first voltage value and said second voltage value.

3. The oscillator according to claim 1 wherein said first switch is placed in parallel with said capacitor and short-circuits said capacitor during said second time period.

4. The oscillator according to claim 1 wherein said at least one resistance is connected in parallel with said capacitor.

5. The oscillator according to claim 1, further comprising a second switch that selectively couples said current generator to said capacitor.

6. The oscillator according to claim 5 wherein said second switch switches from a first state to a second state in response to the voltage at the terminal of said capacitor.

7. A integrated circuit comprising a programmable oscillator according to claim 1 that comprises only a first control pin and a second control pin external to said integrated circuit:
   wherein said current generator is coupled to said first pin; and
   said capacitor is coupled to said second pin.

8. A controller circuit for lamps of the ballast type comprising:
   a half bridge that drives a lamp, said half bridge being controlled by an oscillator that comprises a capacitor;
   a current generator couplable to said capacitor and that generates a charging current for said capacitor;
   at least one resistance coupled to said capacitor and operable to discharge the capacitor during a first time period;
   a comparator coupled to said capacitor for comparing a voltage at a terminal of said capacitor with a prefixed reference voltage and for generating an output signal; and
   a first switch, controlled by said output signal, coupled to said capacitor, and operable to discharge said capacitor during a second time period that is different than the first time period.

9. An oscillator, comprising:
   a capacitor having first and second nodes;
   a current source operable to be coupled to the first node of the capacitor and to charge the capacitor during a charge portion of an oscillating period;
   a resistor coupled to the first node of the capacitor and operable to discharge the capacitor during a discharge portion of the oscillating period; and
   a discharge switch coupled to the first node of the capacitor and operable to discharge the capacitor during only a part of the discharge portion of the oscillating period.

10. The oscillator of claim 9 wherein the second node of the capacitor is coupled to ground.

11. The oscillator of claim 9 wherein the resistor is in electrical parallel with the capacitor.

12. The oscillator of claim 9 wherein the part of the discharge portion of the oscillating period comprises an end of the discharge portion of the oscillating period.

13. The oscillator of claim 9, further comprising an oscillator switch operable to couple the current source to the first node of the capacitor during the charge portion of the oscillating period.

14. An oscillator, comprising:
   a capacitor having first and second nodes;
   a current source operable to be coupled to the first node of the capacitor and to charge the capacitor during a charge portion of an oscillating period;
   a resistor coupled to the first node of the capacitor and operable to discharge the capacitor during a first part of a discharge portion of the oscillating period;
   a discharge switch having a drive node coupled to the first node of the capacitor and having a control node, the discharge switch operable to discharge the capacitor during a second part of the discharge portion; and an oscillator switch operable to couple the current source to the first node of the capacitor during the charge portion of the oscillating period and operable to couple the control node of the discharge switch to the first node of the capacitor during the discharge portion of the oscillating period.

15. An integrated circuit, comprising:
a first terminal operable to be coupled to an external capacitor and to a first external resistor that is operable to discharge the capacitor during a discharge portion of an oscillating period;
a current source operable to be coupled to the first terminal and to charge the capacitor with a charge current during a charge portion of the oscillating period; and
a second terminal coupled to the current source and operable to be coupled to a second external resistor that is operable to set a value of the charge current without conducting the charge current.

16. A lamp control circuit, comprising:
a first terminal operable to be coupled to an external capacitor and to a first external resistor that is operable to discharge the capacitor during a discharge portion of an oscillating period;
a current source operable to be coupled to the first terminal and to charge the capacitor with a charge current during a charge portion of the oscillating period;
a second terminal coupled to the current source and operable to be coupled to a second external resistor that is operable to set a value of the charge current;
a third terminal operable to provide a drive signal to the lamp; and
a generator coupled to the first and third terminals and operable to generate the drive signal in response to a voltage across the capacitor.

17. A method, comprising:
charging a capacitor with a current source during a charge portion of an oscillating period;
discharging the capacitor through a resistor during a first part of a discharge portion of the oscillating period; and
discharging the capacitor through a switch during a second part of the discharge portion of the oscillating period, the second part being different than the first part.

18. The method of claim 17 wherein the resistor is in electrical parallel with the capacitor.

19. The method of claim 17 wherein the first part of the discharge portion of the oscillating period includes the entire discharge portion.

20. The method of claim 17, further comprising uncoupling the current source from the capacitor while discharging the capacitor.

* * * * *